(12) United States Patent
Yu

(10) Patent No.: US 7,436,264 B2
(45) Date of Patent: Oct. 14, 2008

(54) CHARGE SUPPLY APPARATUS AND METHOD IN FREQUENCY SYNTHESIZER

(75) Inventor: Hwa-Yeal Yu, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 70 days.

(21) Appl. No.: 11/496,652

(22) Filed: Jul. 31, 2006

(65) Prior Publication Data

US 2007/0024381 A1     Feb. 1, 2007

(30) Foreign Application Priority Data

Aug. 1, 2005    (KR)   ...................... 10-2005-0070256

(51) Int. Cl.
    *H03L 7/08*      (2006.01)
(52) U.S. Cl. ............................. 331/17; 331/11; 331/16; 327/157
(58) Field of Classification Search ................... 331/11, 331/16, 17; 327/157; 455/260; 375/376
See application file for complete search history.

(56) References Cited

U.S. PATENT DOCUMENTS

| | | | | |
|---|---|---|---|---|
| 4,546,330 A * | 10/1985 | Okada | ......................... | 331/17 |
| 5,220,294 A * | 6/1993 | Ichikawa | ...................... | 331/17 |
| 6,407,641 B1 | 6/2002 | Williams et al. | ............ | 331/1 A |
| 6,580,329 B2 * | 6/2003 | Sander | ......................... | 331/17 |
| 6,597,249 B2 | 7/2003 | Chien et al. | .................. | 331/177 |
| 6,693,494 B2 * | 2/2004 | Fan | .............................. | 331/17 |
| 6,940,356 B2 * | 9/2005 | McDonald et al. | ............ | 331/16 |
| 7,078,977 B2 * | 7/2006 | Maneatis | ...................... | 331/16 |
| 7,151,413 B2 * | 12/2006 | Lin | .............................. | 331/11 |
| 2003/0034846 A1 | 2/2003 | Fan | | |

OTHER PUBLICATIONS

Korean Patent Application No. 1020020049138 to Albon et al., having Publication date of Mar. 3, 2003 (w/ English Abstract page).
Japanese Patent Application No. 08-249584 to Kazuyuki et al., having Publication date of Apr. 14, 1998 (w/ English Abstract page).

* cited by examiner

*Primary Examiner*—Robert J. Pascal
*Assistant Examiner*—Levi Gannon
(74) *Attorney, Agent, or Firm*—Monica H. Choi

(57) ABSTRACT

A charge supplying apparatus in a frequency synthesizer includes first and second charge supply units. The first charge supply unit is activated for generating a first voltage coupled to a loop filter, and the second charge supply unit is activated for generating a second voltage coupled to the loop filter. A control unit has a mode determining unit that activates one of the first and second charge supply units from comparing a reference frequency with an output frequency. The mode determining unit also generates at least one control signal for adjusting the first voltage by binary increments for decreasing a difference between the reference and output frequencies.

20 Claims, 10 Drawing Sheets

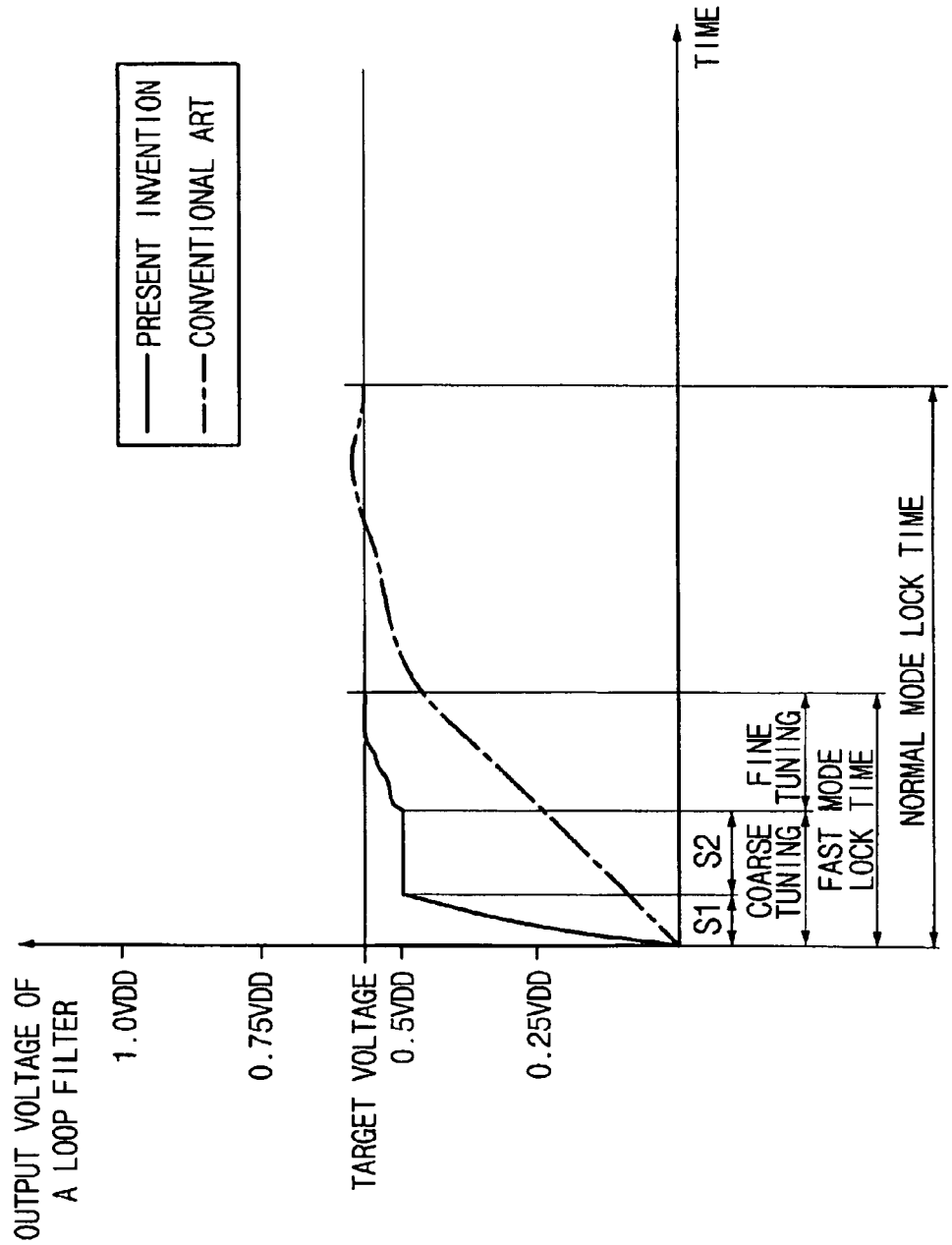

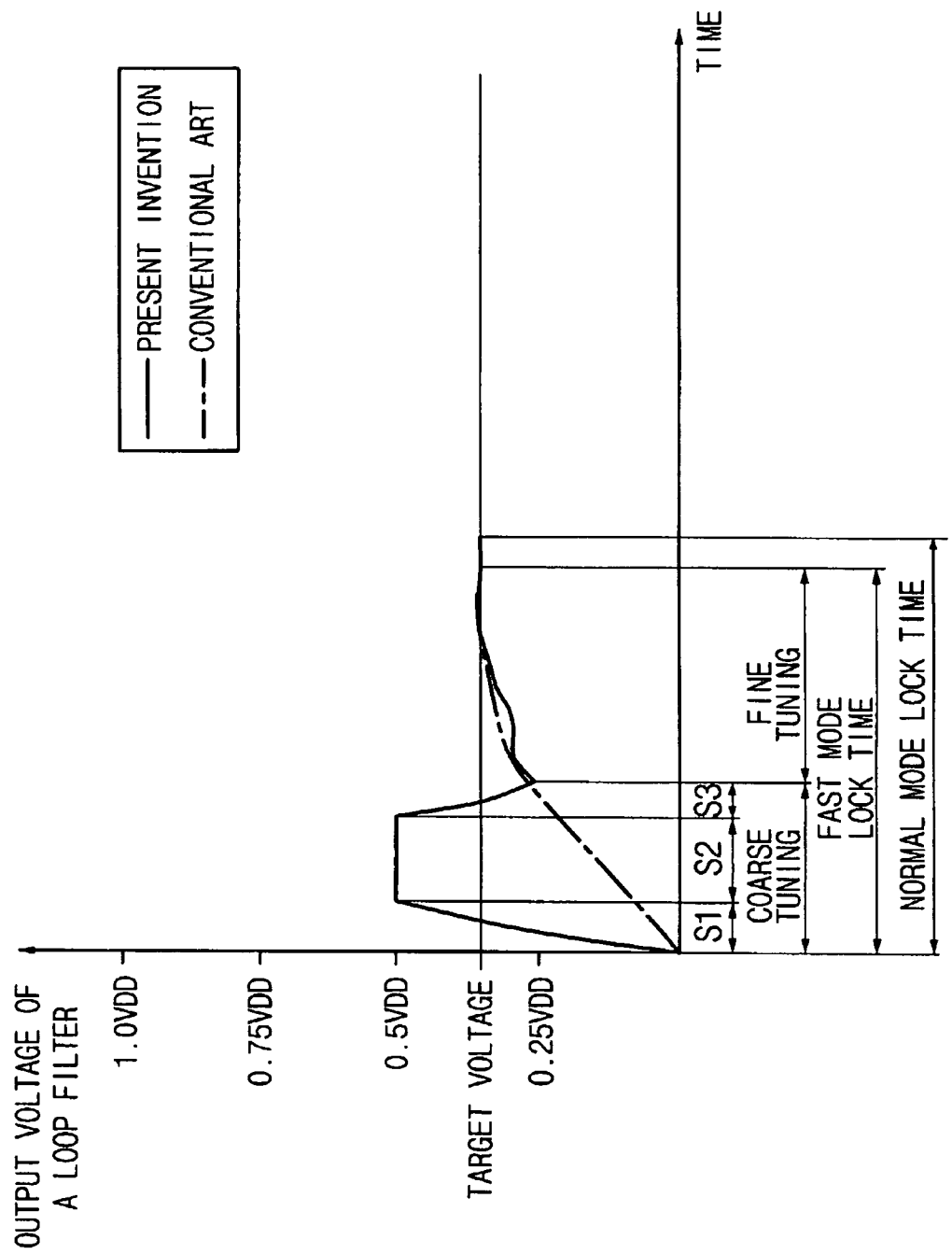

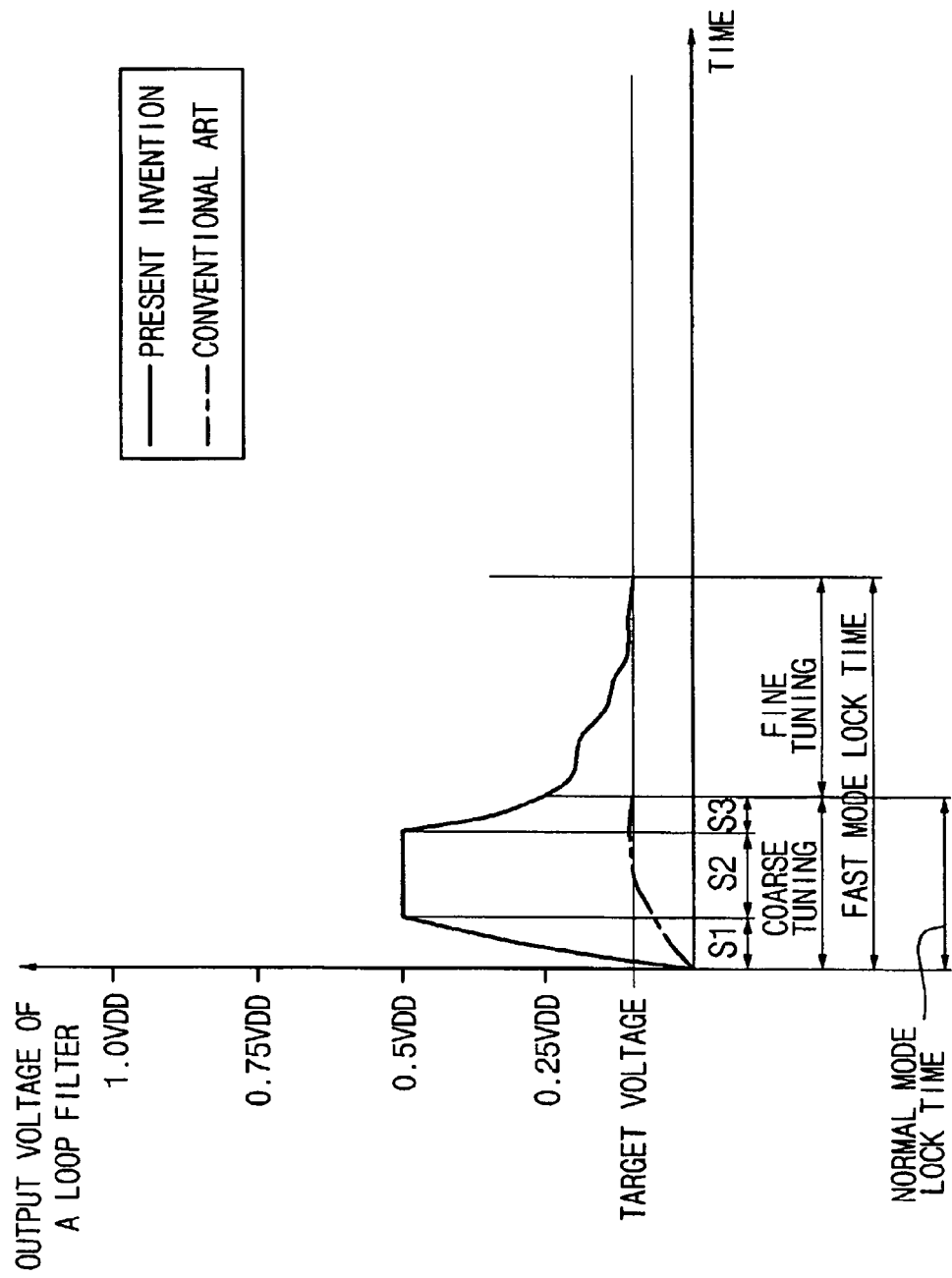

CHARGE SUPPLY APPARATUS AND METHOD IN FREQUENCY SYNTHESIZER

This application claims priority to Korean Patent Application No. 2005-70256, filed on Aug. 1, 2005 in the Korean Intellectual Property Office, the disclosure of which is incorporated herein in its entirety by reference.

BACKGROUND OF THE INVENTION

1. Field of the Invention

The present invention relates generally to frequency synthesizers, and more particularly, to comparing frequencies for fast coarse frequency adjustment and to subsequently comparing phases for fine frequency adjustment.

2. Description of the Related Art

For mobile communications, a frequency synthesizer is commonly used in a transceiver to generate a signal with a desired frequency. The frequency synthesizer includes a voltage-controlled oscillator (VCO) with a phase-locked loop (PLL) for feedback control of the VCO that generates the signal with the desired frequency.

FIG. 1 shows a block diagram of a conventional frequency synthesizer 100 including a reference frequency generator 110, a VCO 160, a first frequency divider 170, a second frequency divider 120, a phase/frequency detector 130, a charge pump 140, and a loop filter 150.

The reference frequency generator 110 generates a reference signal with a stable reference frequency (FR) regardless of variation in temperature. Such a reference frequency generator 110 is implemented with a temperature-compensated crystal oscillator (TCXO) for example.

The VCO 160 generates an output signal with an output frequency (FO) that is determined by a control voltage generated by the loop filter 150. In general, the output frequency (FO) is proportional to such a control voltage.

The phase/frequency detector 130 detects a phase (and/or a frequency) difference between the reference signal from the generator 110 and the output signal from the VCO 160. In general, the phase/frequency detector 130 detects a phase (and/or a frequency) difference between a divided reference signal from the second frequency divider 120 having a frequency F2 that is the reference frequency FR divided by a dividing factor M and a divided output signal from the first frequency divider 170 having a frequency F1 that is the output frequency FO divided by a dividing factor N. When a channel of the transceiver is changed, the second number N that is the dividing factor of the first frequency divider 170 is also changed for varying the frequency FO of the output signal from the VCO 160.

The phase/frequency detector 130 generates an up signal or a down signal based on the phase/frequency difference. The up or down signal is provided to the charge pump 140 that provides the loop filter 150 with a charge corresponding to the up or down signal. The loop filter 150 outputs the control voltage based on the charge provided from the charge pump 140. The control voltage from the loop filter 150 has a DC level from low-pass filtering an output signal of the charge pump 140. The control voltage from the loop filter 150 is provided to the VCO 160.

In the conventional frequency synthesizer 100, a charge supply speed of the charge pump 140 is increased for accommodating a wide frequency band for the transceiver. That is, the charge pump 140 operates with a relatively high level of current for accommodating the wide frequency band.

However with such a high current level in the charge pump 140, a frequency lock time may be increased due to a ringing phenomenon. To prevent the ringing phenomenon, the conventional frequency synthesizer 100 includes a dummy resistor. In any case, a size of the charge pump 140 is undesirably increased with the high current level.

Alternatively, U.S. Pat. No. 6,597,249 to Chien et al. discloses a digital coarse frequency tuning block for fast coarse frequency tuning. However, such a digital tuning block generates a digital code such that a digitally controlled VCO is required. Such a digitally controlled VCO may undesirably require additional capacitor elements with increased area of the VCO.

Therefore, a frequency synthesizer capable of achieving a fast frequency lock time without increasing the size of the components of the frequency synthesizer is desired.

SUMMARY OF THE INVENTION

Accordingly, the present invention provides coarse and fine frequency tuning with charge supply units that provide voltages for faster frequency locking without increased size of components.

A charge supplying apparatus in a frequency synthesizer according to an aspect of the present invention includes first and second charge supply units. The first charge supply unit is activated for generating a first voltage coupled to a loop filter, and the second charge supply unit is activated for generating a second voltage coupled to the loop filter. A control unit has a mode determining unit that activates one of the first and second charge supply units from comparing a reference frequency with an output frequency. The mode determining unit also generates at least one control signal for adjusting the first voltage by binary increments for decreasing a difference between the reference and output frequencies when the first charge supply unit is activated.

In a further aspect of the present invention, a resistor within the loop filter is short-circuited when the first charge supply unit is activated for faster coarse frequency tuning. The resistor is activated within the loop filter when the second charge supply unit is activated for preventing a ringing phenomenon.

In an example embodiment of the present invention, the loop filter generates a control voltage depending on a level of the first or second voltage. The control voltage determines the output frequency of an output signal generated by a voltage-controlled oscillator (VCO).

In another embodiment of the present invention, the control unit further includes first and second frequency dividers. The first frequency divider generates a divided output signal having the output frequency divided by a first number N. The second frequency divider generates a divided reference signal having the reference frequency divided by a second number M. The mode determining unit activates the first charge supply unit and deactivates the second charge supply unit when a frequency difference between the divided output signal and the divided reference signal is greater than or equal to a threshold. Alternatively, the mode determining unit deactivates the first charge supply unit and activates the second charge supply unit when the frequency difference between the divided output signal and the divided reference signal is less than the threshold.

In a further embodiment of the present invention, the control unit includes a phase detector that determines a phase difference between the divided reference signal and the divided output signal. The second charge supply unit adjusts the second voltage for decreasing the phase difference.

In an example embodiment of the present invention, the first charge supply unit includes a plurality of resistors and a plurality of switches. The resistors are coupled in series between a power voltage source and a ground node, and each switch is tapped off a node between a respective two of the resistors. The at least one control signal from the control unit determines which one of the switches is closed for coupling a voltage between the respective two resistors as the first voltage.

In another embodiment of the present invention, a middle one of the switches is closed at power reset or channel change. In a further embodiment of the present invention, each of the resistors has a substantially same resistance.

In this manner, coarse and fine frequency tunings are performed with analog voltages within the feed-back loop having the loop filter and the VCO of the frequency synthesizer. The initial coarse frequency tuning speeds up the frequency adjustment process. By using the loop filter and the VCO in the feed-back loop of the frequency synthesizer, the components of the frequency synthesizer are not increased in size.

BRIEF DESCRIPTION OF THE DRAWINGS

The above and other features and advantages of the present invention will become more apparent when described in detailed exemplary embodiments thereof with reference to the attached drawings in which:

FIGS. 6A, 6B, 6C, and 6D show timing diagrams illustrating a frequency locking process upon a channel change, according to an example embodiment of the present invention.

The figures referred to herein are drawn for clarity of illustration and are not necessarily drawn to scale. Elements having the same reference number in FIGS. 1, 2, 3, 4, 5, 6A, 6B, 6C, 6D, and 7 refer to elements having similar structure and/or function.

DETAILED DESCRIPTION OF THE INVENTION

Figure 1:
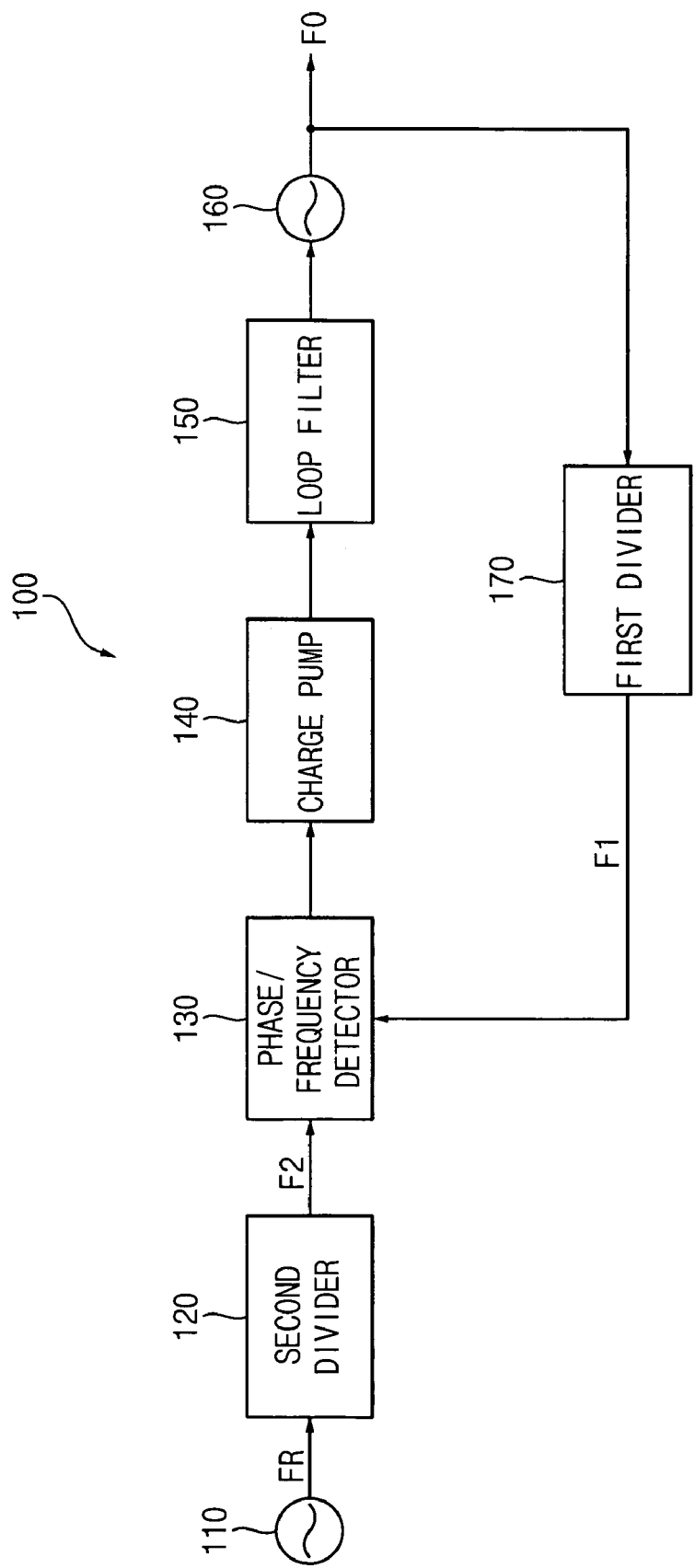
FIG. 1 shows a block diagram of a conventional frequency synthesizer.
Figure 2:
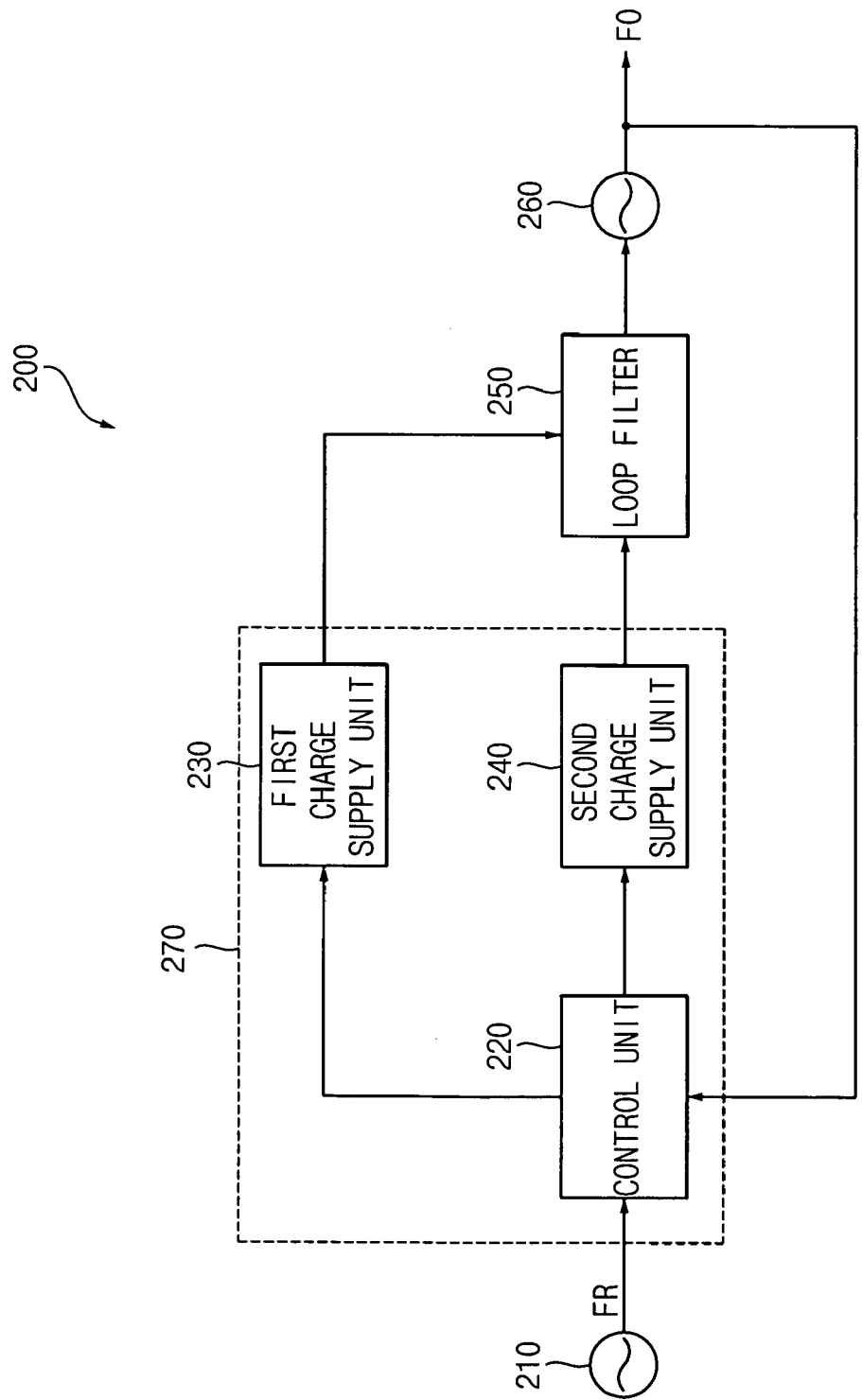
FIG. 2 shows a block diagram of a frequency synthesizer, according to an example embodiment of the present invention.

FIG. 2 shows a block diagram of a frequency synthesizer 200 with a charge supplying apparatus 270 according to an example embodiment of the present invention. The frequency synthesizer 200 also includes a reference frequency generator 210, a loop filter 250, and a voltage-controlled oscillator (VCO) 260.

The reference frequency generator 210 generates a reference signal with a stable reference frequency (FR) regardless of variation in temperature. In an example embodiment of the present invention, the reference frequency generator 210 is implemented with a temperature-compensated crystal oscillator (TCXO).

The VCO 260 generates an output signal with an output frequency (FO) that is determined by a control voltage generated by the loop filter 250. The loop filter 250 generates the control voltage based on charge provided from the charge supplying apparatus 270. The charge supplying apparatus 270 includes a control unit 220, a first charge supply unit 230, and a second charge supply unit 240.

Figure 3:
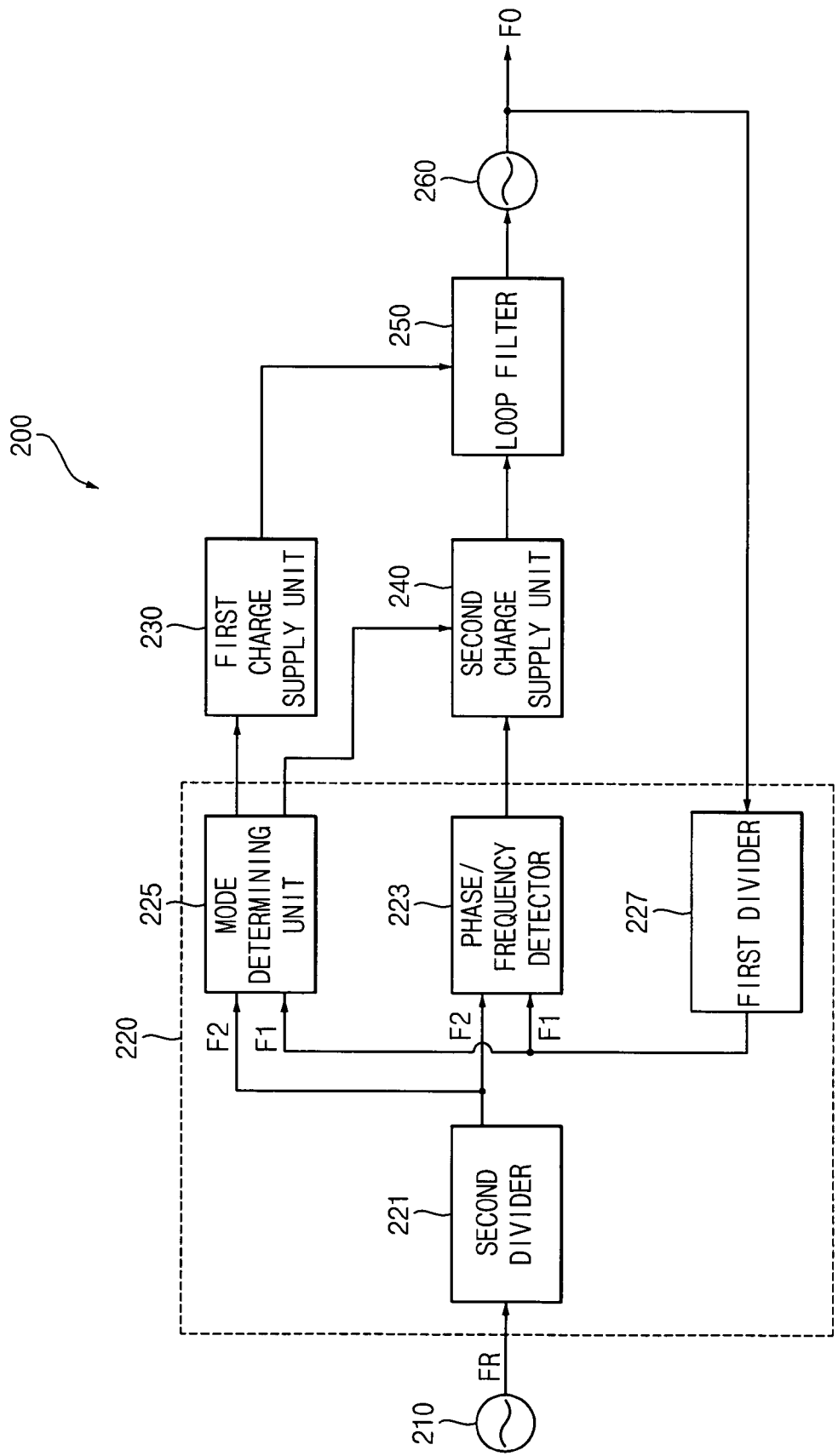
FIG. 3 shows a block diagram of components within a control unit of FIG. 2, according to an example embodiment of the present invention.

FIG. 3 shows a block diagram of components in the control unit 220 for the frequency synthesizer 200 of FIG. 2. The control unit 220 includes a first divider 227, coupled to the VCO 260, for generating a divided output signal having a divided output frequency F1 that is the output frequency FO divided by a first number N. When a channel is changed, the frequency synthesizer 200 generates the output signal with the output frequency FO corresponding to the changed channel. Thus, the dividing factor N is adjusted accordingly to the changed channel.

In addition, the control unit 220 includes a second divider 221, coupled to the reference frequency generator 210, for generating a divided reference signal having a divided reference frequency F2 that is the reference frequency FR divided by a second number M. The control unit 220 also includes a phase/frequency detector 223 and a mode determining unit 225 that input the divided output signal and the divided reference signal from the first and second dividers 227 and 221.

Figure 4:
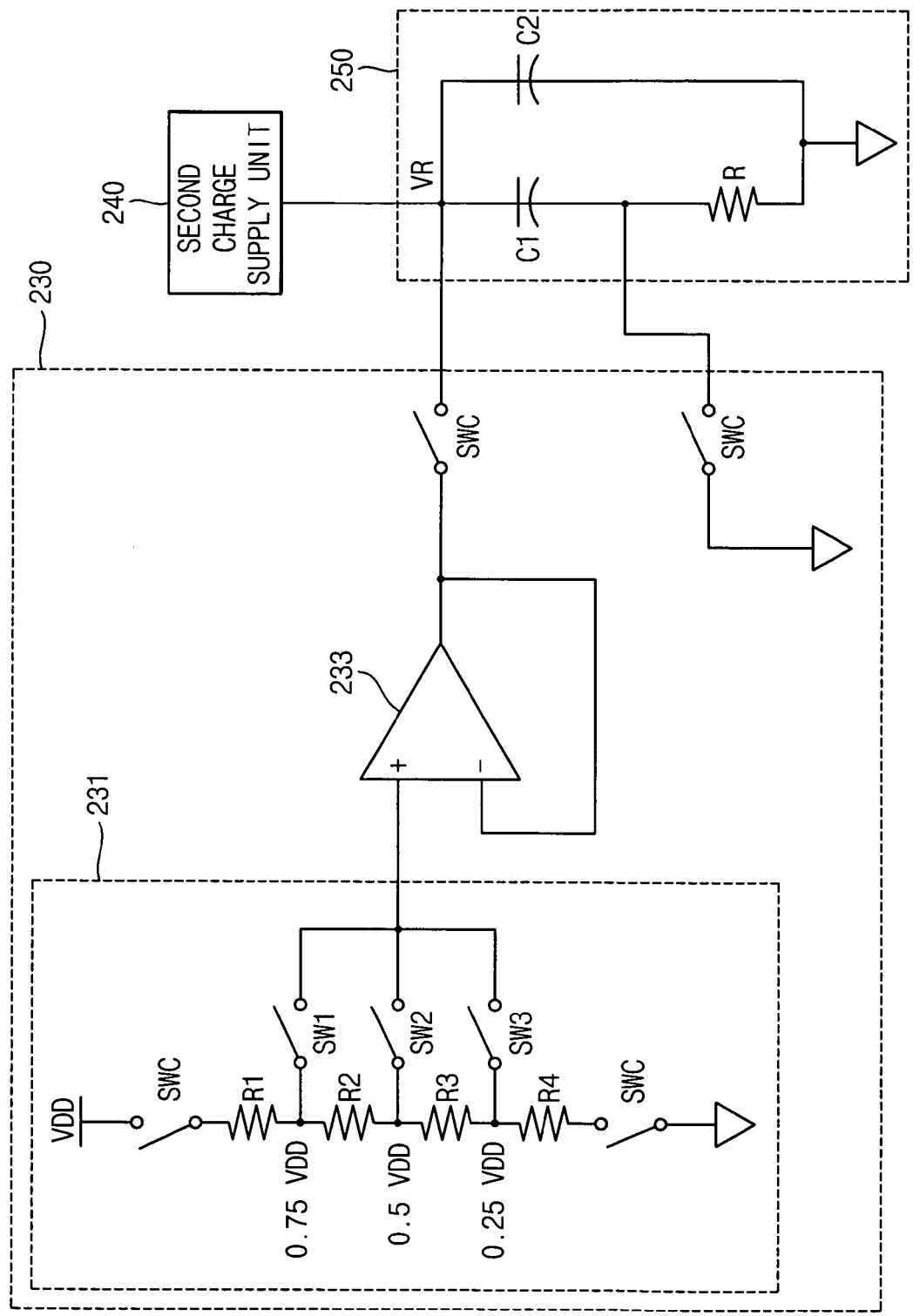
FIG. 4 shows a circuit diagram of a first charge supply unit of FIGS. 2 and 3, according to an example embodiment of the present invention.

FIG. 4 shows a circuit diagram of the first charge supply unit 230 according to an example embodiment of the present invention. The first charge supply unit 230 includes a voltage supply unit 231 and a buffer 233. The voltage supply unit 231 generates a first voltage that is adjusted by binary increments based on at least one control signal from the control unit 220.

The voltage supply unit 231 includes a plurality of resistors R1, R2, R3, and R4 coupled in series between a power supply voltage VDD and a ground node. In addition, the voltage supply unit 231 includes a plurality of switches SW1, SW2, and SW3 with each switch tapped off from a node between respective two resistors. The control unit 220 generates at least one control signal for closing one of the switches SW1, SW2, and SW3. The closed one of the switches couples a voltage at one of the nodes between the respective two of the resistors R1, R2, R3, and R4 as the first voltage to the buffer 233.

The first charge supply unit 230 further includes control switches SWC that are closed or opened by the control unit 220 for activating or deactivating the first charge supply unit 230. The buffer 233 is coupled in negative feed-back with the output of the buffer 233 being coupled to a negative input of the buffer 233. The positive input of the buffer 233 is coupled to the switches SW1, SW2, and SW3.

The buffer 233 buffers the first voltage from the voltage supply unit 231 and transmits the buffered first voltage to the loop filter 250 when the control switches SWC are closed. The loop filter 250 includes capacitors C1 and C2 and a resistor R configured as illustrated in FIG. 4. The resistor R of the loop filter 250 is short-circuited when the control switches SWC are closed for activating the first charge supply unit 230. With the resistor R being short-circuited, the capacitors C1 and C2 rapidly accumulate charge with the first voltage provided from the activated first charge supply unit 230.

Figure 5:
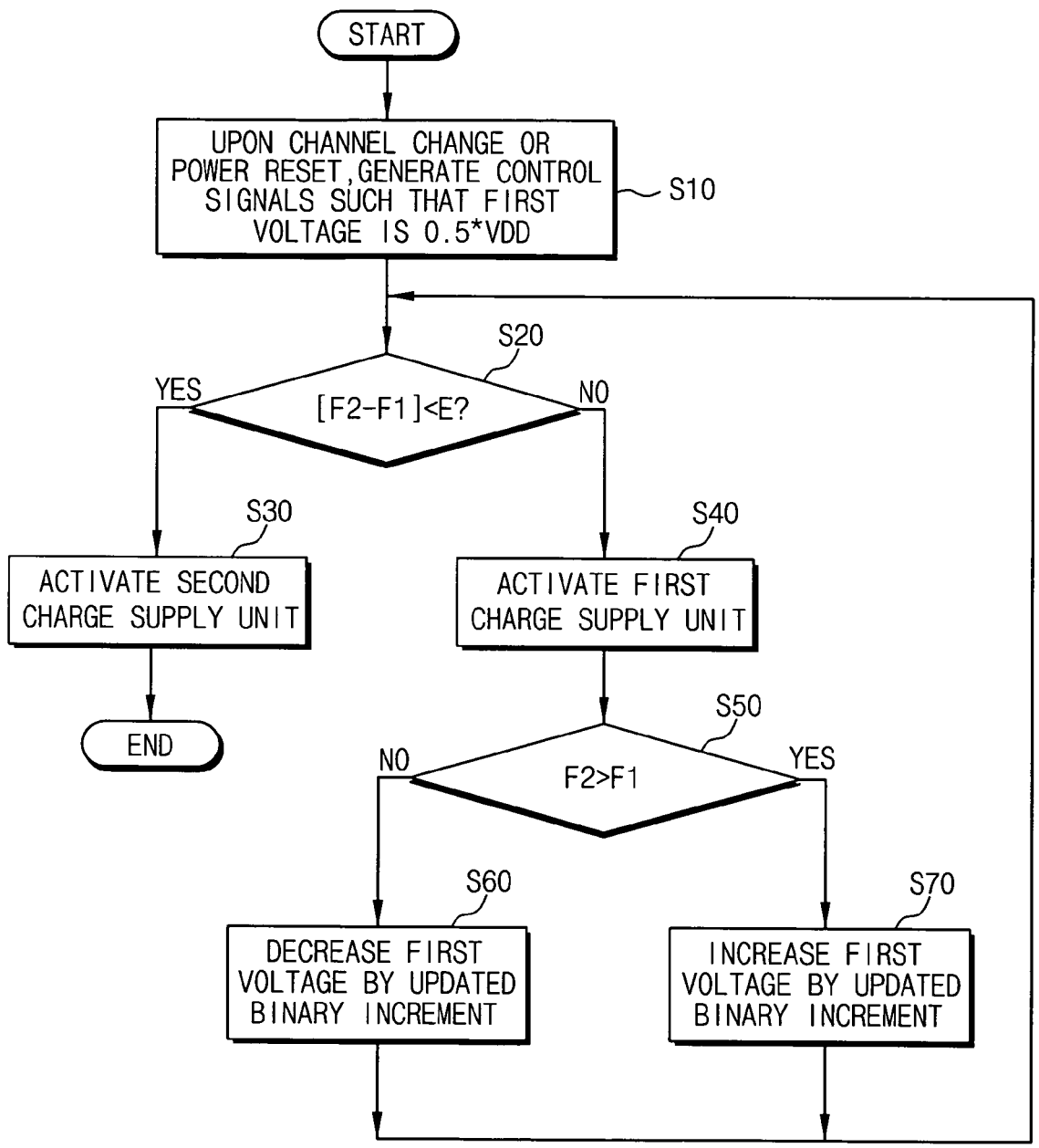
FIG. 5 shows a flowchart of steps performed by a mode determining unit of the control unit in FIGS. 2 and 3, according to an example embodiment of the present invention.
Figure 7:
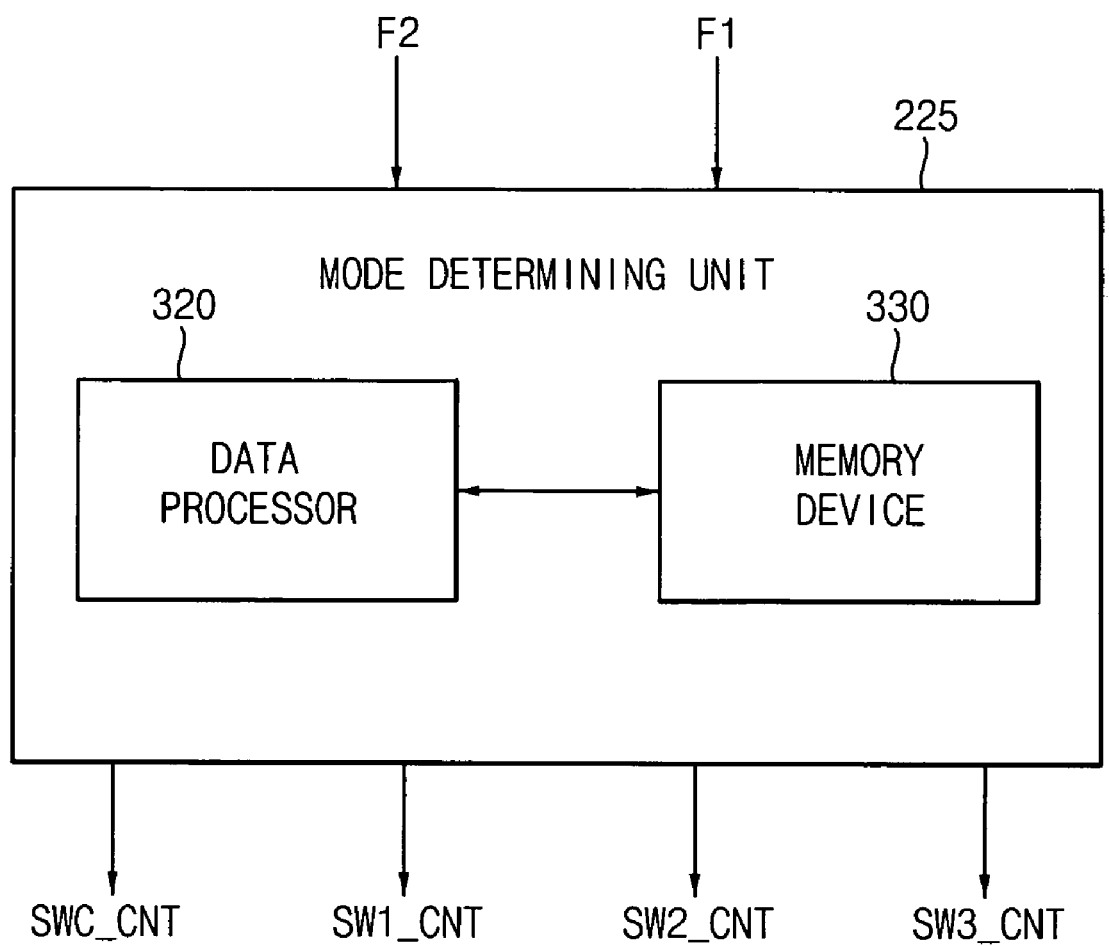
FIG. 7 shows a block diagram of the mode determining unit in FIGS. 2 and 3, according to an example embodiment of the present invention.

Operation of the components of FIGS. 2, 3, and 4 is now described in reference to the flowchart of FIG. 5, according to an example embodiment of the present invention. FIG. 7 shows an example implementation of the mode determining unit 225 within the control unit 220. The mode determining unit 225 includes a data processor 320 and a memory device 330 having sequences of instructions (i.e., software) stored thereon.

Execution of such sequences of instructions by the data processor 320 causes the data processor 320 to perform any steps/functions/operations described herein for the mode determining unit 225. For example referring to FIG. 7, the mode determining unit 225 compares the divided frequencies F1 and F2 for generating control signals SWC_CNT, SW1_CNT, SW2_CNT, and SW3_CNT.

The control signal SWC_CNT determines whether the control switches SWC are closed or open for activating or deactivating the first charge supply unit 230. The control signals SW1_CNT, SW2_CNT, and SW3_CNT determine which one of the switches SW1, SW2, and SW3 is closed for determining the level of the first voltage generated from the first charge supply unit 230.

Referring to FIGS. 2, 3, 4, 5, and 7, when a channel is changed or power is reset (step S10), the output frequency (FO) is not locked to the reference frequency (FR). Thus when the channel is changed or the power is reset, the mode determining unit 225 generates the control signal SWC_CNT to close the control switches SWC such that the first charge supply unit 230 is activated and such that the second charge supply unit 240 is deactivated.

In addition, the mode determining unit 225 generates the control signals SW1_CNT, SW2_CNT, and SW3_CNT for closing the middle switch SW2 such that the voltage generated from the voltage supply unit 231 is a middle voltage 0.5*VDD (step S10 of FIG. 5). Subsequently, the mode determining unit 225 compares the divided output frequency F1 with the divided reference frequency F2.

In one embodiment of the present invention, the mode determining unit 225 counts a number of cycles for the divided output signal having the first divided frequency F1 and a number of cycles of the divided reference signal having the second divided frequency F2 during a predetermined time period. Then, the mode determining unit 225 calculates a difference between such counted number of cycles for determining a difference between the divided frequencies F1 and F2.

If the difference between the divided frequencies F1 and F2 is smaller than a threshold value E (step S20 of FIG. 5), the mode determining unit 225 generates the control signal SWC_CNT to open the control switches SWC such that the first charge supply unit 230 is deactivated and such that the second charge supply unit 240 is activated (step S30 of FIG. 5). In that case, the phase/frequency detector 223 controls the second charge supply unit 240 to generate a charge corresponding to a phase difference between the divided output and reference signals as detected by the phase/frequency detector 223.

Additionally in that case, the loop filter 250 generates the control voltage from such charge provided by the second charge supply unit 240. The control voltage from the loop filter 250 determines the output frequency FO of the output signal generated by the VCO 260. Such a feed-back loop for phase matching forms a phase-lock-loop (PLL) that is individually known to one of ordinary skill in the art.

Referring back to FIG. 5, if the difference between the divided frequencies F1 and F2 is greater than or equal to a threshold value E (step S20 of FIG. 5), the mode determining unit 225 generates the control signal SWC_CNT to close the control switches SWC such that the first charge supply unit 230 is activated and such that the second charge supply unit 240 is deactivated (step S40 of FIG. 5). Also in that case, the mode determining unit 225 generates the control signals SW1_CNT, SW2_CNT, and SW3_CNT for adjusting the first voltage generated by the voltage supply unit 231 by a binary increment.

Referring to FIGS. 4 and 5, the resistors R1, R2, R3, and R4 have a substantially same resistance value. Initially, the first voltage generated by the voltage supply unit 231 is the middle voltage that is ½*VDD. If the divided reference frequency F2 is greater than the divided output frequency F1 (step S50 of FIG. 5), the output frequency FO is increased by in turn increasing the first voltage generated by the voltage supply unit 231 (step S70 of FIG. 5).

For example, when the divided reference frequency F2 is greater than the divided output frequency F1, the mode determining unit 225 generates the control signals SW1_CNT, SW2_CNT, and SW3_CNT such that the switch SW1 is the one that is closed. In that case, the first voltage generated by the voltage supply unit 231 is increased to 0.75*VDD from the middle voltage 0.5*VDD by a binary increment of ½ times the middle voltage of 0.5*VDD.

On the other hand if the divided reference frequency F2 is less than the divided output frequency F1 (step S50 of FIG. 5), then the output frequency FO is decreased by in turn decreasing the first voltage generated by the voltage supply unit 231 (step S60 of FIG. 5). In that case, the mode determining unit 225 generates the control signals SW1_CNT, SW2_CNT, and SW3_CNT such that the switch SW3 is the one that is closed. Thus, the first voltage generated by the voltage supply unit 231 is decreased to 0.25*VDD from the middle voltage 0.5*VDD by a binary increment of ½ times the middle voltage of 0.5*VDD.

In either case of step S60 or step S70 being performed, the output frequency FO is adjusted accordingly. The mode determining unit 225 returns to step S20 in FIG. 5 to determine if the difference between the divided frequencies F1 and F2 is greater than or equal to the threshold value E with such an adjusted output frequency FO.

In this manner, steps S40, S50, S60, and S70 are repeated iteratively until the difference between the divided frequencies F1 and F2 become less than the threshold value E. For each iteration, the first voltage generated by the voltage supply unit 231 is decreased (in step S60 of FIG. 5) or increased (in step S70 of FIG. 5) with a binary increment of $(½^n)$ times the middle voltage of 0.5*VDD, with n being the n-th iteration. Thus, a binary search method is used for determining the first voltage that minimizes the difference between the frequencies FR and FO.

For example, assume that the first voltage generated by the voltage supply unit 231 after the first iteration through steps S40, S50, and S60 is 0.25*VDD. Then, during the second iteration through steps S40, S50, and S60 or S70, the first voltage generated by the voltage supply unit 231 is either decreased or increased from 0.25*VDD by the binary increment of $(½^2)$ times the middle voltage of 0.5*VDD.

In that case, the voltage supply unit 231 would be implemented with more resistors and more switches than those illustrated in the example of FIG. 4. Generally, the voltage supply unit 231 may be implemented with any number of resistors and switches for providing adjustment with n-iterations. Four resistors R1, R2, R3, and R4 and three switches SW1, SW2, and SW3 are illustrated in FIG. 4 for simplicity and clarity of illustration.

In any case, when the difference between the divided frequencies F1 and F2 is not smaller than the threshold value E, the first charge supply unit 230 supplies the first voltage to the loop filter 250 for coarse adjustment of the output frequency FO. Thus, steps S40, S50, and S60 or S70 are performed using the first charge supply unit 230 for coarse adjustment of the output frequency FO.

Referring to FIG. 4, the control switches SWC are closed for activating the first charge supply unit 230 for such coarse frequency adjustment. The closed SWC switch short-circuits the resistor R within the loop filter 250. Thus, a node VR of the capacitors C1 and C2 may be charged to the first voltage from the first charge supply unit 230 with faster speed during such coarse adjustment with the activated first charge supply unit 230.

Eventually, the difference between the divided frequencies F1 and F2 becomes smaller than the threshold value E, and step S30 is performed with the second charge supply unit 240 for fine adjustment of the output frequency FO. The second charge supply unit 240 provides the second voltage to the loop filter 250 in finer increments from phase comparison between the divided reference signal and the divided output signal. When the phase difference between the reference signal and the output signal become insignificant, such signals are phase-locked with the output frequency FO becoming constant, and the flow-chart of FIG. 5 ends after step S30.

During the step S30, the first charge supply unit 230 is deactivated and the second charge supply unit 240 is activated, with the control switches SWC being opened. With the control switches SWC being opened, the resistor R of the loop filter 250 is coupled to the capacitor C1 to prevent an excessive ringing phenomenon during the fine frequency adjustment by the second charge supply unit 240.

For an example of the frequency dividing factors N and M of the first and second dividers 227 and 221, respectively, assume that the VCO 260 is initially set to provide an output frequency FO of about 1.8 GHz and that the reference frequency generator 210 is set to provide an reference frequency FR of about 19.2 MHz. In addition, assume that the frequency synthesizer 200 is employed in a communication device having a channel interval of about 60 KHz.

In the above case, since the second divided frequency (F2) should be 60 KHz, a second dividing rate M is calculated as 19.2 MHz/60 KHz (i.e., 320). The first divided frequency (F1) should also be 60 KHz so that the first dividing rate N is calculated as 1.8 GHz/60 KHz (i.e., 30,000). Thus, the first divider 227 generates one cycle of the divided output signal after counting cycles of the output signal from the VCO 260, 30,000 times, and the second divider 221 generates one cycle of the divided reference signal after counting cycles of the reference signal from the reference generator 210, 320 times.

To increase the output frequency (FO) by 120 KHz in order to change a channel (i.e., FO=1.8 GHz+120 KHz), the first dividing rate N needs to be changed to 30,002. That is, the first divider 227 generates one cycle of the divided output signal after counting cycles of the output signal from the VCO 260, 30,002 times. The first charge supply unit 230 and the second charge supply unit 240 operate with the loop filter 250 until the first divided frequency (F1) becomes equal to the second divided frequency (F2). In that case, the first divided frequency (F1) becomes 60 KHz, and the output frequency (FO) becomes 60 KHz×30,002=1.80012 GHz.

FIGS. 6A, 6B, 6C, and 6D are timing diagrams illustrating a locking process in the frequency synthesizer 200 when a channel is changed. For illustrative purposes, it is assumed that an initial output frequency is the lowest frequency of the frequency synthesizer 200.

Figure 6A:
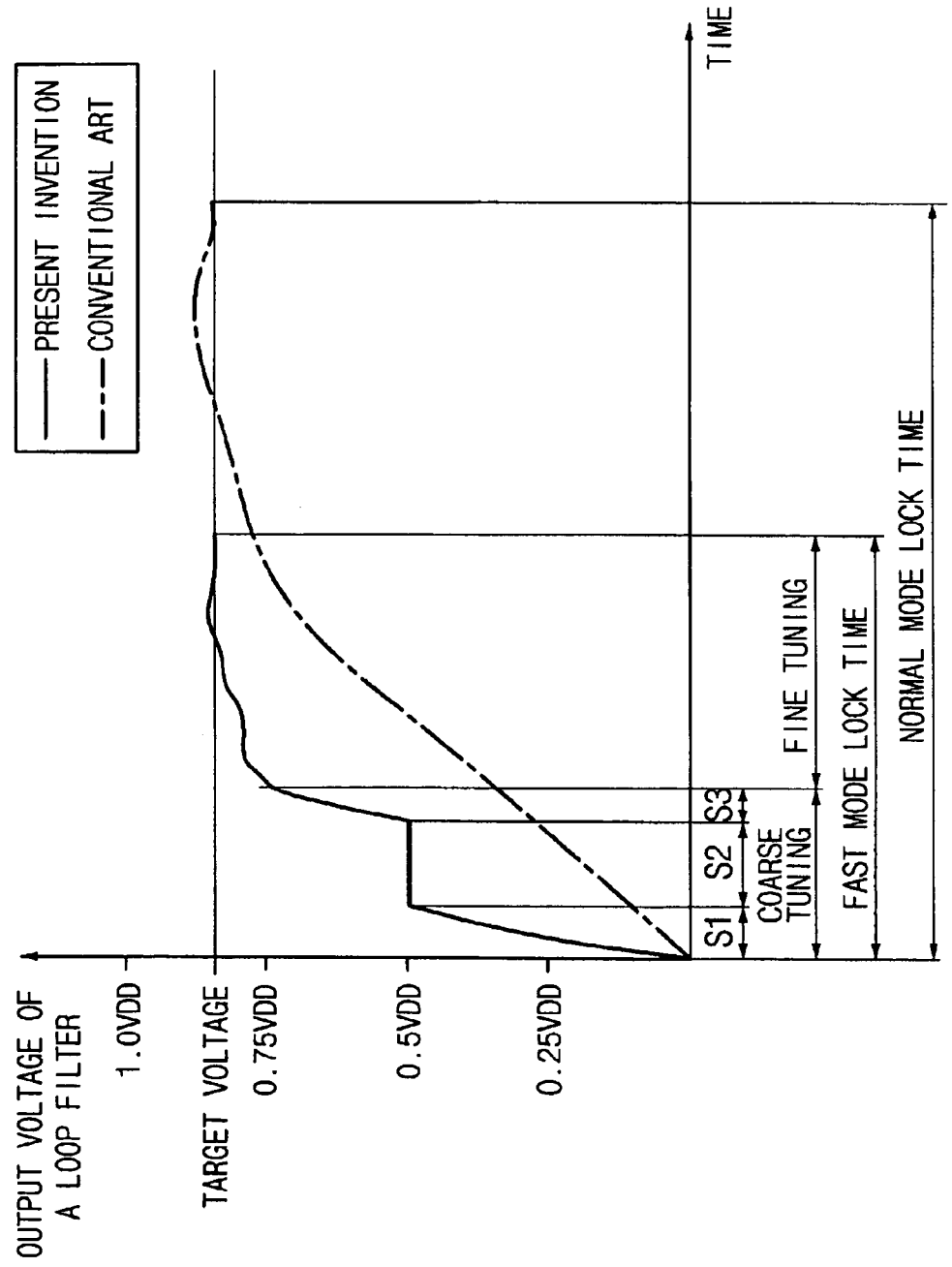

Referring to FIG. 6A, the target voltage provided to the loop filter 250 is above 0.75*VDD. Thus, a large amount of charge needs to be provided so as to increase such a target voltage to the loop filter 250 from an initial voltage of about 0 V. A conventional frequency synthesizer operating at normal speed has a long lock time as illustrated in FIG. 6A.

In contrast, by activating the first charge supply unit 230 for coarse frequency tuning with faster speed, the voltage to the loop filter is rapidly increased to near the target voltage. Thereafter, fine tuning is performing by the second charge supply unit 240 to further match the voltage to loop filter 250 with the target voltage. Therefore, the total lock time is shortened with the frequency synthesizer 200 as compared to the conventional frequency synthesizer in FIG. 6A.

Time interval S1 in FIGS. 6A, 6B, 6C, and 6D indicates a time period for supplying the loop filter with sufficient charge such that the voltage of the loop filter 250 reaches the middle voltage level of 0.5*VDD. Time interval S2 indicates a time period when the control unit 220 determines a mode (i.e., for coarse tuning or fine tuning). Time interval S3 indicates a time period for supplying the loop filter 250 with charge such that the voltage of the loop filter 250 reaches a next voltage level adjusted with the binary increment (i.e., to 0.75*VDD in FIG. 6A).

Referring to another example of FIG. 6B, the target voltage is slightly above 0.5*VDD. With the frequency synthesizer 200 of the present invention, charge is provided to the loop filter 250 at a higher speed with coarse frequency tuning during the time period of S1 until the voltage to the loop filter 250 reaches 0.5*VDD. A charge supply mode is determined during the time period of S2. A fine frequency tuning is performed until the voltage of the loop filter reaches the target voltage. The total lock time is shortened with the frequency synthesizer 200 as compared to the conventional frequency synthesizer in FIG. 6B.

Referring to another example of FIG. 6C, the target voltage is slightly above 0.25*VDD. With the frequency synthesizer 200 of the present invention, charge is provided to the loop filter 250 at a higher speed during the time period of S1 so that the voltage of the loop filter 250 reaches the middle voltage of 0.5*VDD. A charge supply mode is determined during the time period of S2. Charge is provided to the loop filter 250 at a higher speed with coarse frequency adjustment during the time period of S3 to force the voltage of the loop filter 250 to 0.25*VDD.

Thereafter, fine tuning is performed to match the voltage of the loop filter 250 to the target voltage. In this case, the lock time of the frequency synthesizer 200 of the present invention may be similar with that of the conventional frequency synthesizer.

Referring to another example of FIG. 6D, the target voltage is below 0.25*VDD. With the frequency synthesizer 200 of the present invention, charge is provided to the loop filter 250 at a higher speed during the time period of S1 so that the voltage of the loop filter 250 reaches the middle voltage of 0.5*VDD. A charge supply mode is determined during the time period of S2. Charge is provided to the loop filter 250 at a higher speed with coarse frequency adjustment during the time period of S3 to force the voltage of the loop filter 250 to 0.25*VDD. In this example, the lock time with the frequency synthesizer 200 of the present invention may be longer compared to the prior art.

However, in examples 6A, 6B, and 6C, the total lock time with the frequency synthesizer 200 may be shortened with the faster coarse frequency adjustment. The foregoing is by way of example only and is not intended to be limiting. For example, any numbers or number of elements described and illustrated herein is by way of example only. The present invention is limited only as defined in the following claims and equivalents thereof.

What is claimed is:

1. A charge supplying apparatus comprising:
    a first charge supply unit that is activated for generating a first voltage coupled to a loop filter;
    a second charge supply unit that is activated for generating a second voltage coupled to the loop filter; and
    a control unit having a mode determining unit that activates one of the first and second charge supply units from comparing a reference frequency with an output frequency, wherein the mode determining unit generates at least one control signal for adjusting the first voltage by binary increments for decreasing a difference between the reference and output frequencies when the first charge supply unit is activated, and wherein a resistor within the loop filter is short-circuited when the first charge supply unit is activated and wherein the resistor within the loop filter is activated when the second charge supply unit is activated.

2. The charge supplying apparatus of claim 1, wherein the loop filter generates a control voltage depending on a level of the first or second voltage, and wherein the control voltage determines the output frequency of an output signal generated by a voltage-controlled oscillator (VCO).

3. The charge supplying apparatus of claim 1, wherein the control unit further includes:
   a first frequency divider for generating a divided output signal having the output frequency divided by a first number N; and
   a second frequency divider for generating a divided reference signal having the reference frequency divided by a second number M;
   wherein the mode determining unit activates the first charge supply unit and deactivates the second charge supply unit when a frequency difference between the divided output signal and the divided reference signal is greater than or equal to a threshold; and
   wherein the mode determining unit deactivates the first charge supply unit and activates the second charge supply unit when the frequency difference between the divided output signal and the divided reference signal is less than the threshold.

4. The charge supplying apparatus of claim 1, wherein the control unit includes a phase detector that determines a phase difference between a reference signal having the reference frequency and an output signal having the output frequency, and wherein the second charge supply unit adjusts the second voltage for decreasing the phase difference.

5. The charge supplying apparatus of claim 1, wherein the first charge supply unit includes:
   a plurality of resistors coupled in series between a power voltage source and a ground node; and
   a plurality of switches, each switch being tapped off a node between a respective two of the resistors;
   wherein the at least one control signal from the control unit determines which one of the switches is closed for coupling a voltage between the respective two resistors as the first voltage.

6. The charge supplying apparatus of claim 5, wherein a middle one of the switches is closed at power reset or channel change.

7. The charge supplying apparatus of claim 5, wherein each of the resistors has a substantially same resistance.

8. A frequency synthesizer comprising:
   a reference frequency generator for generating a reference signal having a reference frequency;
   a loop filter for generating a control voltage in response to a level of a first or second voltage;
   a voltage-controlled oscillator (VCO) for generating an output signal having an output frequency determined by the control voltage;
   a first charge supply unit that is activated for generating the first voltage coupled to the loop filter;
   a second charge supply unit that is activated for generating the second voltage coupled to the loop filter; and
   a control unit having a mode determining unit that activates one of the first and second charge supply units from comparing the reference frequency with the output frequency, wherein the mode determining unit generates at least one control signal for adjusting the first voltage by binary increments for decreasing a difference between the reference and output frequencies when the first charge supply unit is activated,
   and wherein a resistor within the loop filter is short-circuited when the first charge supply unit is activated, and wherein the resistor within the loop filter is activated when the second charge supply unit is activated.

9. The frequency synthesizer of claim 8, wherein the control unit further includes:
   a first frequency divider for generating a divided output signal having the output frequency divided by a first number N; and
   a second frequency divider for generating a divided reference signal having the reference frequency divided by a second number M;
   wherein the mode determining unit activates the first charge supply unit and deactivates the second charge supply unit when a frequency difference between the divided output signal and the divided reference signal is greater than or equal to a threshold; and
   wherein the mode determining unit deactivates the first charge supply unit and activates the second charge supply unit when the frequency difference between the divided output signal and the divided reference signal is less than the threshold.

10. The frequency synthesizer of claim 8, wherein the control unit includes a phase detector that determines a phase difference between the reference and output signals, and wherein the second charge supply unit adjusts the second voltage for decreasing the phase difference.

11. The frequency synthesizer of claim 8, wherein the first charge supply unit includes:
    a plurality of resistors coupled in series between a power voltage source and a ground node; and
    a plurality of switches, each switch being tapped off a node between a respective two of the resistors;
    wherein the at least one control signal from the control unit determines which one of the switches is closed for coupling a voltage between the respective two resistors as the first voltage.

12. The frequency synthesizer of claim 11, wherein a middle one of the switches is closed at power reset or channel change.

13. The frequency synthesizer of claim 11, wherein each of the resistors has a substantially same resistance.

14. A method of supplying charge to a loop filter in a frequency synthesizer, comprising:
    activating one of a first charge supply unit and a second charge supply unit from comparing a reference frequency with an output frequency;
    generating a first voltage from the first charge supply unit that is activated, the first voltage being coupled to the loop filter;
    generating a second voltage from the second charge supply unit that is activated, the second voltage being coupled to the loop filter;
    generating at least one control signal for adjusting the first voltage by binary increments for decreasing a difference between the reference and output frequencies when the first charge supply unit is activated;
    short-circuiting a resistor within the loop filter when the first charge supply unit is activated; and activating the resistor within the loop filter when the second charge supply unit is activated.

15. The method of claim 14, wherein the loop filter generates a control voltage depending on a level of the first or second voltage, and wherein the control voltage determines the output frequency of an output signal generated by a VCO (voltage-controlled oscillator) of the frequency synthesizer.

16. The method of claim 14, further comprising:
generating a divided output signal having the output frequency divided by a first number N;
generating a divided reference signal having the reference frequency divided by a second number M;
activating the first charge supply unit and deactivating the second charge supply unit when a frequency difference between the divided output signal and the divided reference signal is greater than or equal to a threshold; and
deactivating the first charge supply unit and activating the second charge supply unit when the frequency difference between the divided output signal and the divided reference signal is less than the threshold.

17. The method of claim 14, further comprising:
detecting a phase difference between a reference signal having the reference frequency and an output signal having the output frequency, and wherein the second charge supply unit adjusts the second voltage for decreasing the phase difference.

18. The method of claim 14, wherein the first charge supply unit includes a plurality of resistors coupled in series between a power voltage source and a ground node, and includes a plurality of switches with each switch being tapped off a node between a respective two of the resistors, and wherein the at least one control signal determines which one of the switches is closed for coupling a voltage between the respective two resistors as the first voltage.

19. The method of claim 18, wherein a middle one of the switches is closed at power reset or channel change.

20. The method of claim 18, wherein each of the resistors has a substantially same resistance.

* * * * *